United States Patent
Khatri et al.

(10) Patent No.: US 11,422,815 B2
(45) Date of Patent: Aug. 23, 2022

(54) SYSTEM AND METHOD FOR FIELD PROGRAMMABLE GATE ARRAY-ASSISTED BINARY TRANSLATION

(71) Applicant: DELL PRODUCTS, LP, Round Rock, TX (US)

(72) Inventors: Mukund P. Khatri, Austin, TX (US); Ramesh Radhakrishnan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 354 days.

(21) Appl. No.: 15/909,936

(22) Filed: Mar. 1, 2018

(65) Prior Publication Data

US 2019/0272174 A1    Sep. 5, 2019

(51) Int. Cl.
  *G06F 9/30*    (2018.01)
  *G06F 9/455*   (2018.01)
  *G06F 15/78*   (2006.01)

(52) U.S. Cl.
  CPC ........ *G06F 9/30174* (2013.01); *G06F 9/4552* (2013.01); *G06F 15/7889* (2013.01)

(58) Field of Classification Search
  CPC . G06F 9/30174; G06F 9/4552; G06F 15/7889
  See application file for complete search history.

(56) References Cited

U.S. PATENT DOCUMENTS

| | | | | |
|---|---|---|---|---|
| 5,119,499 A * | 6/1992 | Tonomura | ............. | G06F 9/3877 712/34 |
| 5,774,694 A * | 6/1998 | Murari | ................. | G06F 9/3001 703/26 |
| 6,223,254 B1 * | 4/2001 | Soni | .................... | G06F 9/30174 711/123 |
| 6,711,667 B1 * | 3/2004 | Ireton | ................ | G06F 9/30174 712/209 |
| 6,779,049 B2 | 8/2004 | Altman et al. | | |
| 7,200,723 B1 * | 4/2007 | Ansari | ................ | G06F 9/30145 711/154 |
| 7,444,495 B1 * | 10/2008 | Snider | ................. | G06F 9/30174 712/18 |
| 8,230,181 B2 | 7/2012 | Wan et al. | | |
| 9,733,942 B2 * | 8/2017 | Abdallah | ............. | G06F 9/30174 |
| 2004/0181785 A1 * | 9/2004 | Zwirner | ................... | G06F 8/52 717/140 |
| 2012/0260042 A1 * | 10/2012 | Henry | ....................... | G06F 9/22 711/125 |
| 2015/0113075 A1 | 4/2015 | Vanderwiel | | |

(Continued)

OTHER PUBLICATIONS

Xu et al., "A Dynamic Binary Translation Framework Based on Page Fault Mechanism in Linux Kernel", 2010, pp. 2284-2289.*

(Continued)

*Primary Examiner* — David J. Huisman
(74) *Attorney, Agent, or Firm* — Larson Newman, LLP

(57) ABSTRACT

Binary translation may be performed by a field programmable gate array (FPGA) integrated with a processor as a single integrated circuit. The FPGA contains multiple blocks of logic for performing different binary translations. The processor may offload the binary translation to the FPGA. The FPGA may use historical logging to skip the binary translation of source instructions that have been previously translated into target instructions.

8 Claims, 12 Drawing Sheets

(56) References Cited

U.S. PATENT DOCUMENTS

2016/0077852 A1\* 3/2016 Kissel, I ............. G06F 9/45516
712/209
2017/0286110 A1\* 10/2017 Agron ................ G06F 9/30145

OTHER PUBLICATIONS

Higuera-Toledano et al., "Distributed, Embedded and Real-time Java Systems", 2012, pp. 168-169.\*
Yao et al., "FPGA Based Hardware-Software Co-Designed Dynamic Binary Translation System", 2013, 4 pages.\*
Rokicki et al., "Hardware-Accelerated Dynamic Binary Translation", Mar. 2017, 7 pages.\*
"Hardware-based instruction translation similar to x86 chips", Jul. 2017, 6 pages, Retrieved from the internet < URL: https://www.reddit.com/r/FPGA/comments/6oie3e/hardwarebased_instruction_translation_similar_to/ >.\*
The Transmeta Code MorphingTM Software: Using Speculation, Recovery, and Adaptive Retranslation to Address Real-Life Challenges, James C. Dehnert, Proceedings of the First Annual IEEE/ACM International Symposium on Code Generation and Optimization, Mar. 27-29, 2003, San Francisco, CA, Transmeta Corporation, pp. 1-10; https://courses.cs.washington.edu/courses/cse548/08wi/papers/transmeta.pdf.

\* cited by examiner

SYSTEM AND METHOD FOR FIELD PROGRAMMABLE GATE ARRAY-ASSISTED BINARY TRANSLATION

FIELD OF THE DISCLOSURE

The present disclosure generally relates to information handling systems, and more particularly relates to field programmable gate array-assisted binary translation of instruction set architectures.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

Binary translation may be performed by a field programmable gate array (FPGA) integrated with a processor as a single integrated circuit. The FPGA contains multiple blocks of logic for performing different binary translations. The processor may offload the binary translation to the FPGA. The FPGA may use historical logging to skip the binary translation of source instructions that have been previously translated into target instructions.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
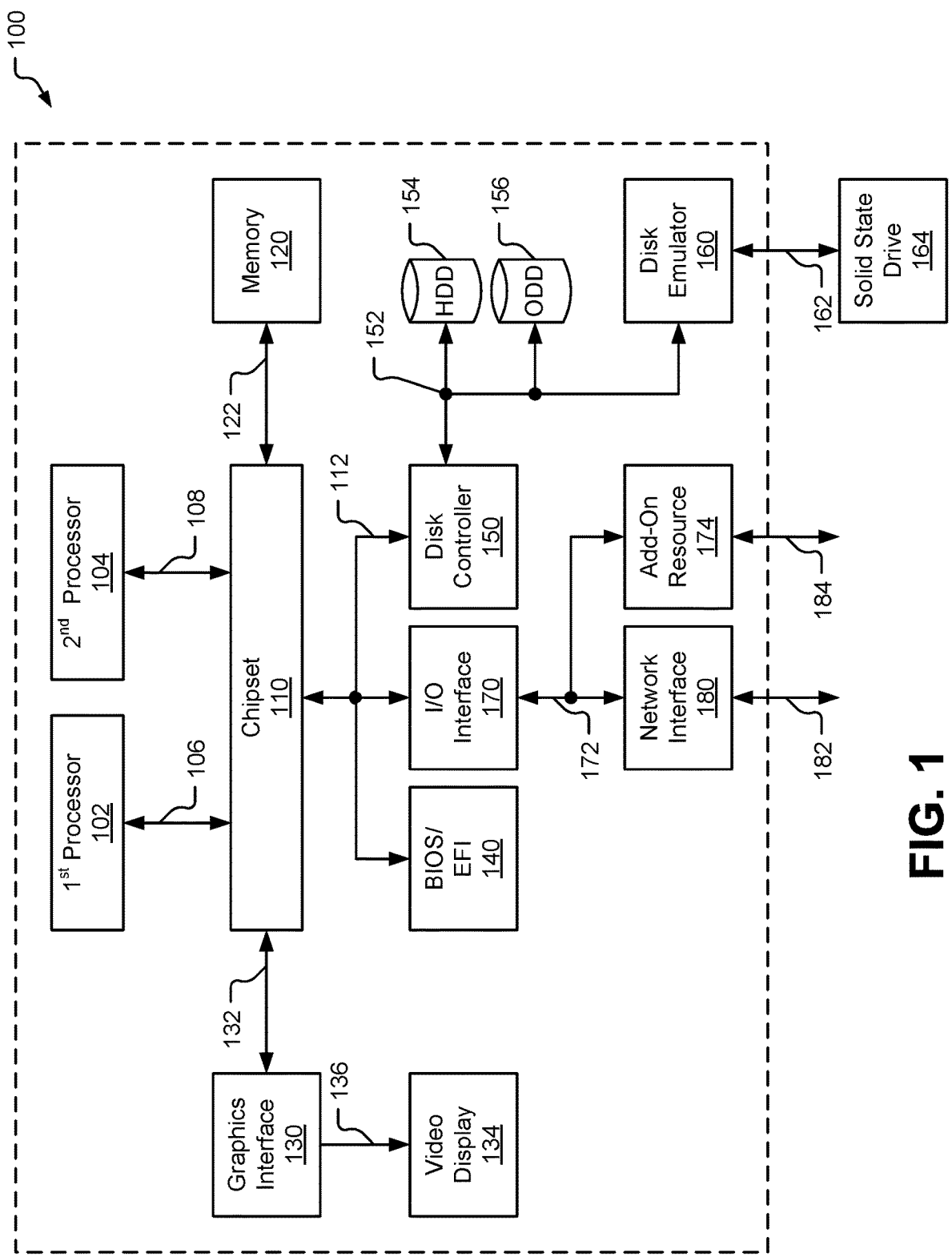
FIG. 1 is a block diagram illustrating an information handling system according to an embodiment of the present disclosure.

FIG. 1 illustrates a generalized embodiment of information handling system 100.

Information handling system 100 has processors 102 and 104, a chipset 110, a memory 120, a graphics interface 130, a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
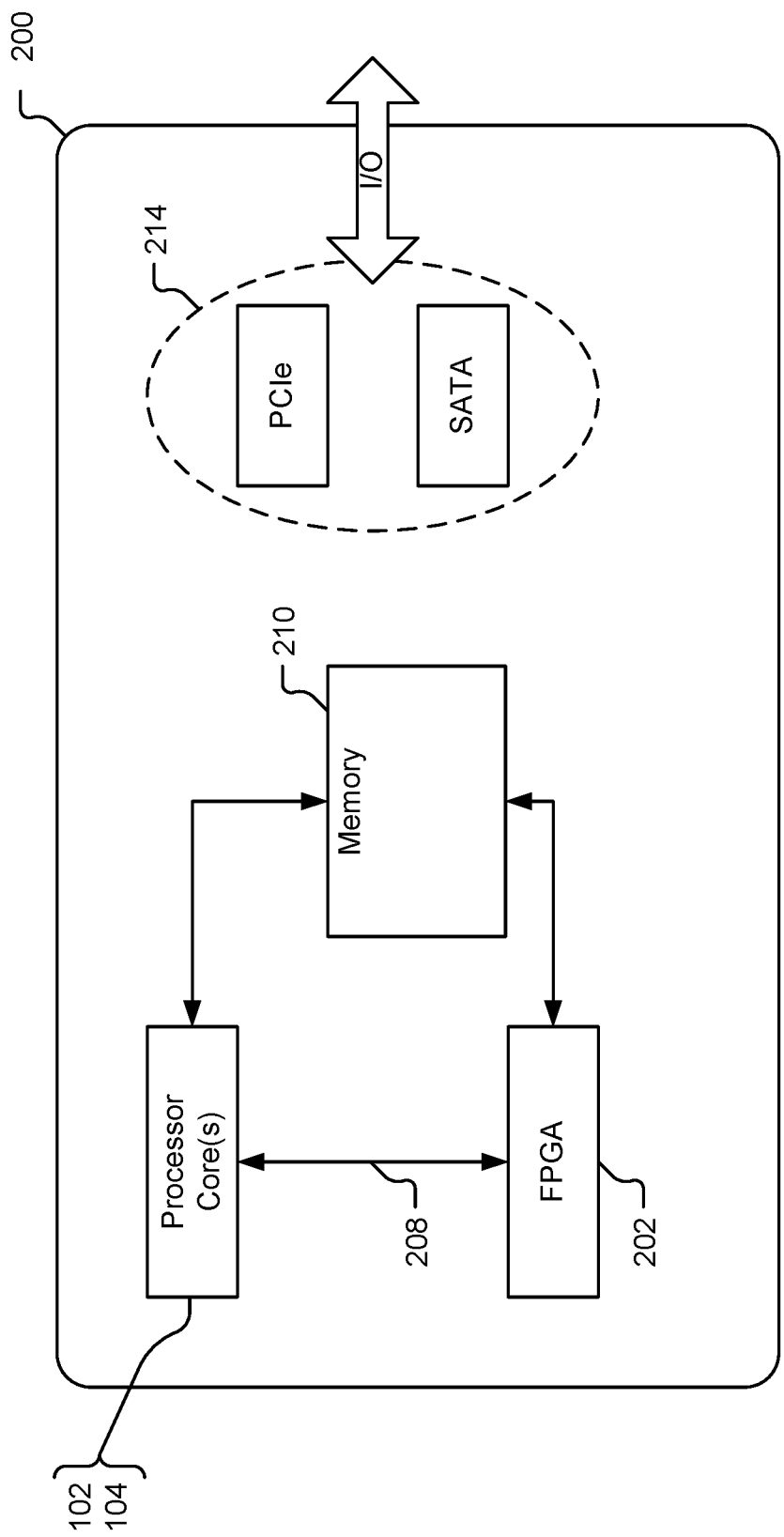
FIG. 2 illustrates an integrated circuit.
Figure 3:
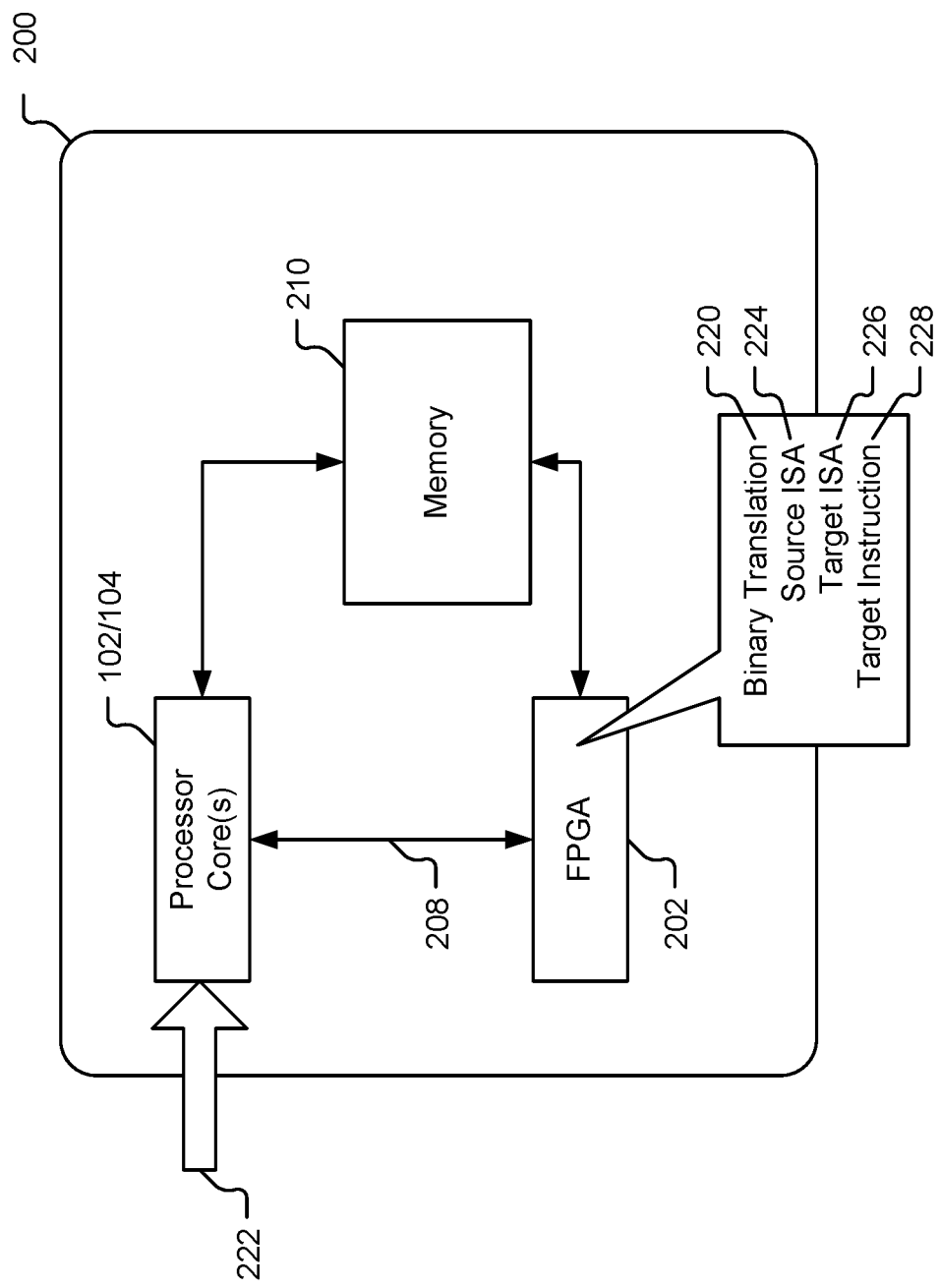
FIGS. 3-6 illustrate FPGA-assisted binary translation, according to exemplary embodiments.

FIG. 2 illustrates an integrated circuit 200 (or chip) that integrates the processor 102/104 and a field programmable gate array (FPGA) 202 into a single silicon-based device as an embedded computing platform. That is, the processor 102/104 and the FPGA 202 are packaged and/or fabricated together in the same die for male/female mating to a single socket (such as a processor socket on a motherboard). Exemplary embodiments may offload workloads from the processor 102/104 to the FPGA 202, thus accelerating execution of processing tasks and instructions. The processor 102/104 and the FPGA 202 are packaged as a hybrid system on chip (SoC). The processor 102/104 and the FPGA 202 may communicate via a network interface to a communications link 208 (such as the point-to-point QuickPoint Interconnect or UltraPath Interconnect). The processor 102/104 and the FPGA 202 may even share an integrated memory device 210, thus allowing the FPGA 202 to have its own dedicated portion or cache memory also fabricated or integrated into the integrated circuit 200. The integrated circuit 200 may further include one or more input/output interfaces 214 for external communications with peripheral devices and cards. While the integrated circuit 200 may include any input/output interface 214, FIG. 2 illustrates the Peripheral Component Interconnect Express (or PCIe) and the Serial ATA (or SATA) interfaces. These input/output interfaces 214 are well-known standards for passing data between the integrated circuit 200 and hard drives, expansion cards, and other devices.

FIGS. 3-6 illustrate a binary translation 220, according to exemplary embodiments. Here the processor 102/104 may offload the binary translation 220 to the FPGA 202 for execution. As the reader may understand, when the integrated circuit 200 receives one or more source instructions 222, the source instructions 222 are formatted or defined according to a source instruction set architecture (or Source ISA) 224. The processor 102/104, however, only executes instructions formatted or defined according to a different target instruction set architecture (or Target ISA) 226. The processor 102/104 may thus send or forward the source instruction 222 (via the embedded or integrated point-to-point communications link 208) to the FPGA 202 for executing the binary translation 220. The FPGA 202 thus accepts the source instruction 222 and translates the source instruction 222 into a target instruction 228 that is formatted or defined according to the target instruction set architecture 226, which is natively executed by the processor 102/104. Here, then, the processor 102/104 offloads the binary translation 220 to the FPGA 202 co-fabricated on the integrated circuit 200. The FPGA 202 thus converts a sequence of input code or instructions (such as a single basic block) into a sequence of output code or instructions. The FPGA 202 sends the target instruction 228 to the processor 102/104 via the communications link 208 for execution.

Figure 4:
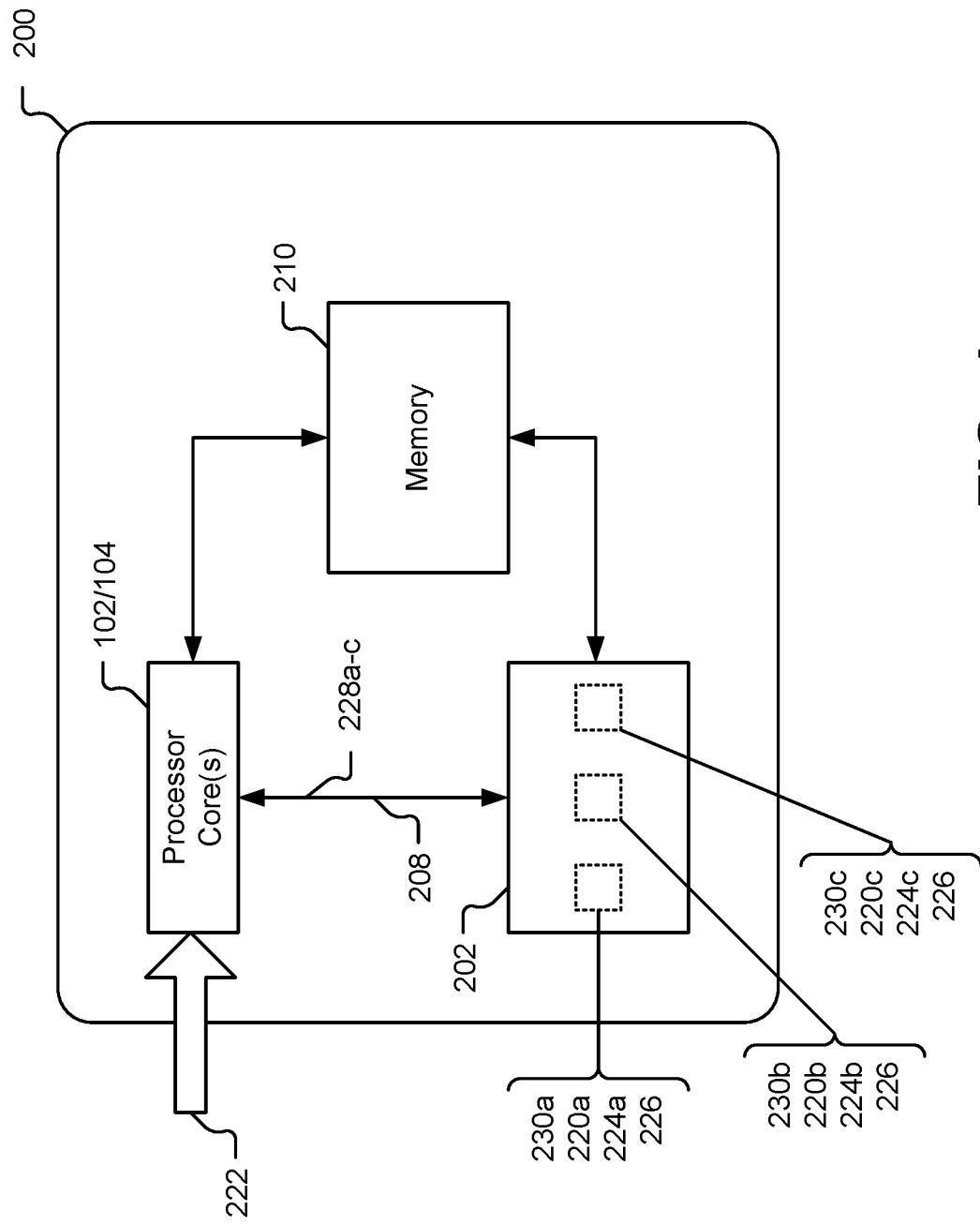

FIG. 4 illustrates blocks 230 of logic. Here the FPGA 202 has multiple, different instruction processing blocks 230 of logic that are dedicated to different binary translations 220. That is, the FPGA 202 may dynamically or statically translate multiple, different source instruction set architectures 224 into the same target instruction set architecture 226 natively executed by the processor 102/104. In actual fabrication the FPGA 202 would have millions or even billion of the blocks 230 of logic. Such complexity, of course, is too difficult to illustrate. FIG. 4 thus illustrates only a simple example of three (3) blocks 230a-c of logic. Each block 230a-c is programmed or configured for a different binary translation 220a-c, depending on the source instruction set architecture 224a-c. A first block 230a of logic, for example, may be programmed, configured, and/or dedicated to the binary translation 220a of PowerPC instructions (224a) to the target instruction 228a associated with the target instruction set architecture 226. A second block 230b of logic may be programmed, configured, and/or dedicated to the binary translation 220b of MIPS instructions (224b) to the target instruction 228b associated with the target instruction set architecture 226. A third block 230c of logic may be programmed, configured, and/or dedicated to the binary translation 220c of any other non-x86 instructions (224c) to the target instruction 228c associated with the target instruction set architecture 226. Each different source instruction set architecture 224a-c, in other words, may have its corresponding block 230a-c of logic for performing the corresponding binary translation 220a-c.

Exemplary embodiments are useful for legacy translations. While the binary translation 220 may be used regardless of source and target, the binary translation 220 is particularly useful for legacy x86 systems and software applications. As one example, the integrated circuit 200 (such as the system on chip) that natively executes RISC-V ISA (which is an open source ISA) may utilize the appropriate block 230 of logic in the FPGA 202 for efficient execution of legacy applications.

Figure 5:
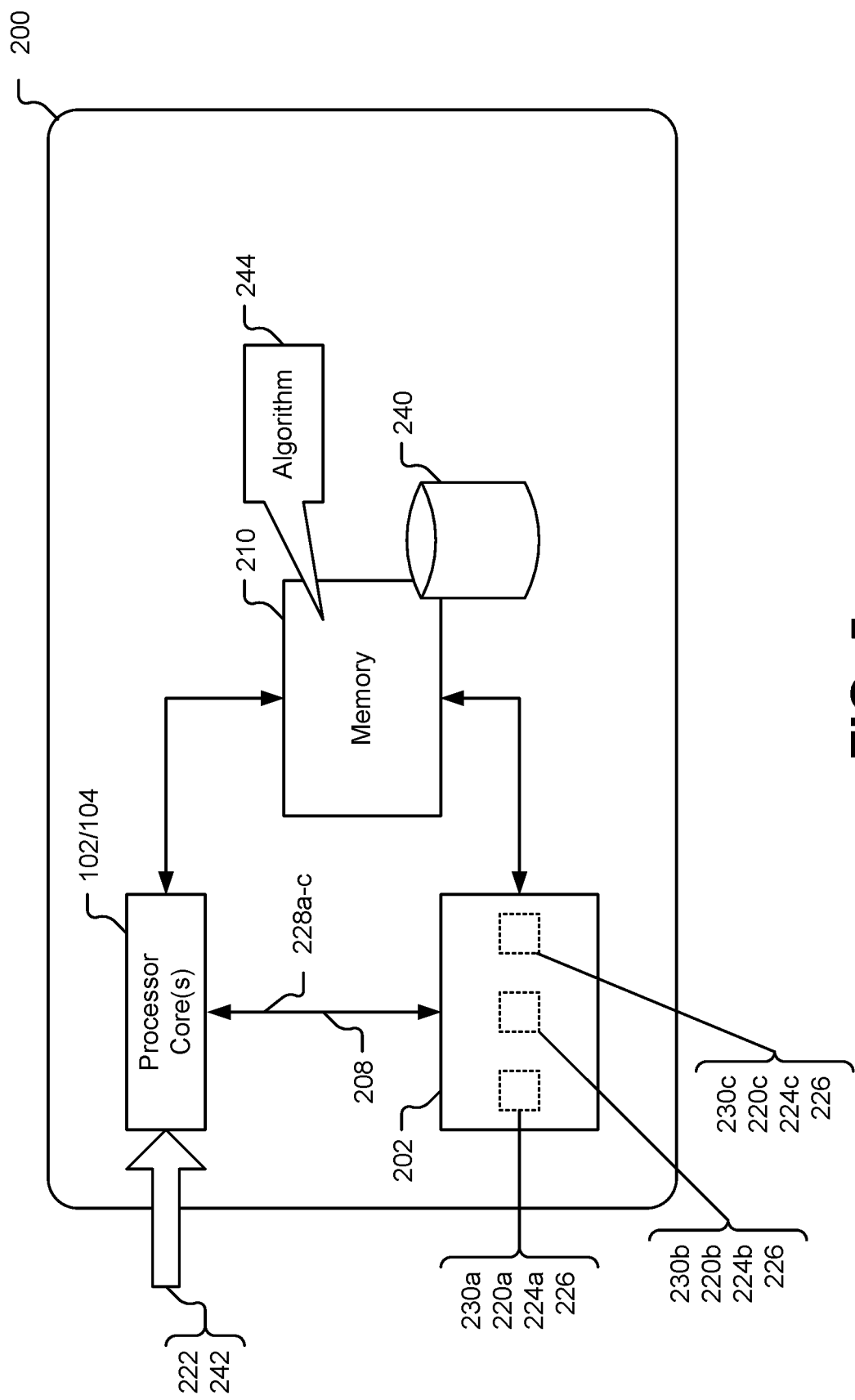
Figure 6:
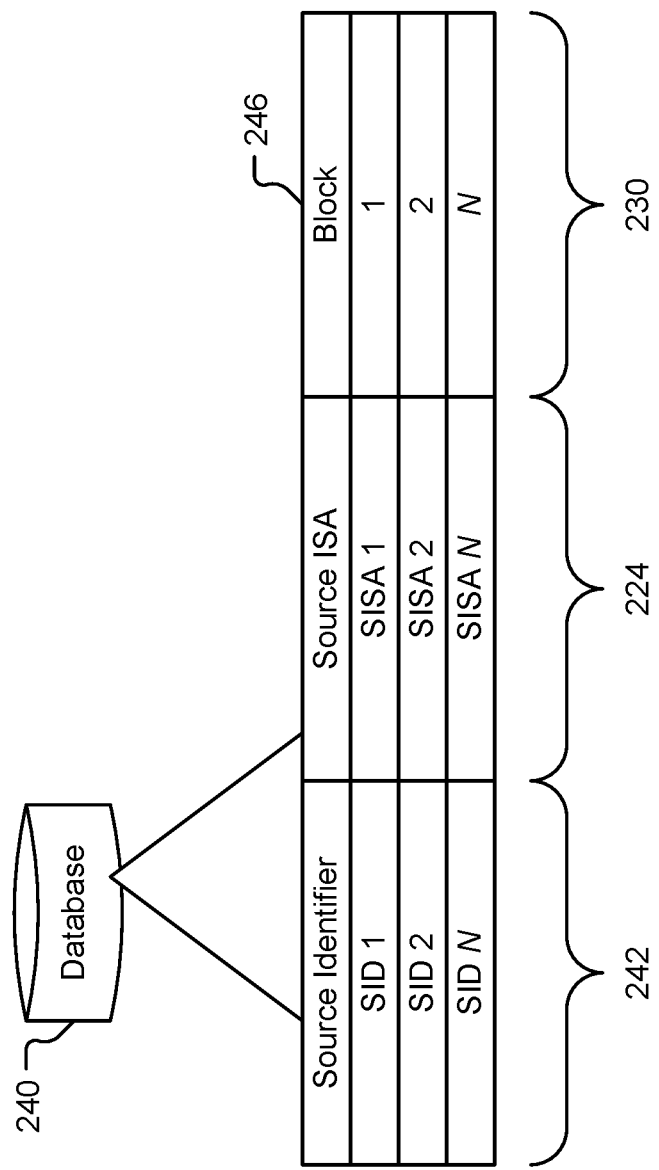

FIGS. 5-6 illustrate an electronic database 240 of binary translations. Here exemplary embodiments may determine which block 230a-c of logic is used for the appropriate binary translation 220a-c. For example, when the processor 102/104 receives the source instruction 222, the source instruction 222 may include, specify, or be associated with a source identifier 242. The source identifier 242 uniquely represents or identifies the source instruction set architecture 224. When the processor 102/104 sends the source instruction 222 to the FPGA 202, the processor 102/104 may also send or include the source identifier 242. The FPGA 202 executes an algorithm 244 (perhaps locally stored in the memory 210) that determines which block 230a-c of logic is used for the binary translation 220. The algorithm 244, for example, instructs or causes the FPGA 202 to query the database 240 of binary translations for the source identifier 242 (or any other information that represents the source instruction set architecture 224). While the database 240 of binary translations may have any logical and/or physical structure, FIG. 6 illustrates a table 246 that electronically maps, relates, or associates different source identifiers 242 and/or different source instruction set architectures 224 to their corresponding block 230 of logic. The FPGA 202 identifies the appropriate block 230 of logic that is mapped, related, or associated to the source identifier 242 and/or the source instruction set architecture 224.

Returning to FIG. 5, the correct block 230 of logic is now known. The algorithm 244 causes the FPGA 202 to identify the correct block 230 of logic that performs the binary translation 220 to the target instruction set architecture 226 natively executed by the processor 102/104. When the processor 102/104 fetches the source instruction 222 and offloads the binary translation 220, the FPGA 202 queries the database 240 of binary translations to determine the block 230 of logic. The FPGA 202 sends the source instruction 222 to the block of logic 230 (such as perhaps using or referencing an address or pointer), thus generating the target instruction 228 as a result. The FPGA 202 sends the target instruction 228 (via the communications link 208) to the processor 102/104 for execution.

Exemplary embodiments thus provide an elegant solution. Because the processor 102/104 and the FPGA 202 may be fabricated as the single device, exemplary embodiments are able to execute the binary translation 220 much faster than conventional schemes. The processor 102/104 offloads the binary translation 220, thus freeing the processor 102/104 for other tasks. Exemplary embodiments provide a much faster translation time and very low latency with less translation overhead.

Exemplary embodiments are also adaptable and reprogrammable. As the reader may understand, the FPGA 202 may be reprogrammed at any time. The FPGA 202 has millions or billions of gates that are programmed to store and/or execute logical instructions. The internal blocks 230 of logic (implemented within the FPGA 202) may thus be changed to support any conversion. In simple words, the FPGA 202 may be tailored via software programming and/or updates (perhaps via the Internet) to support any binary translation 220 from different source instruction set architectures 224 to the target instruction set architecture 226. Indeed, as fabrication techniques improve, the number of gates will increase, thus providing even more blocks 230 of logic supporting many different binary translations 220 for many different source instruction set architectures 224. The integrated circuit 200 may thus support a wide variety of programming/software inputs, thus providing a much longer service life.

Figure 7:
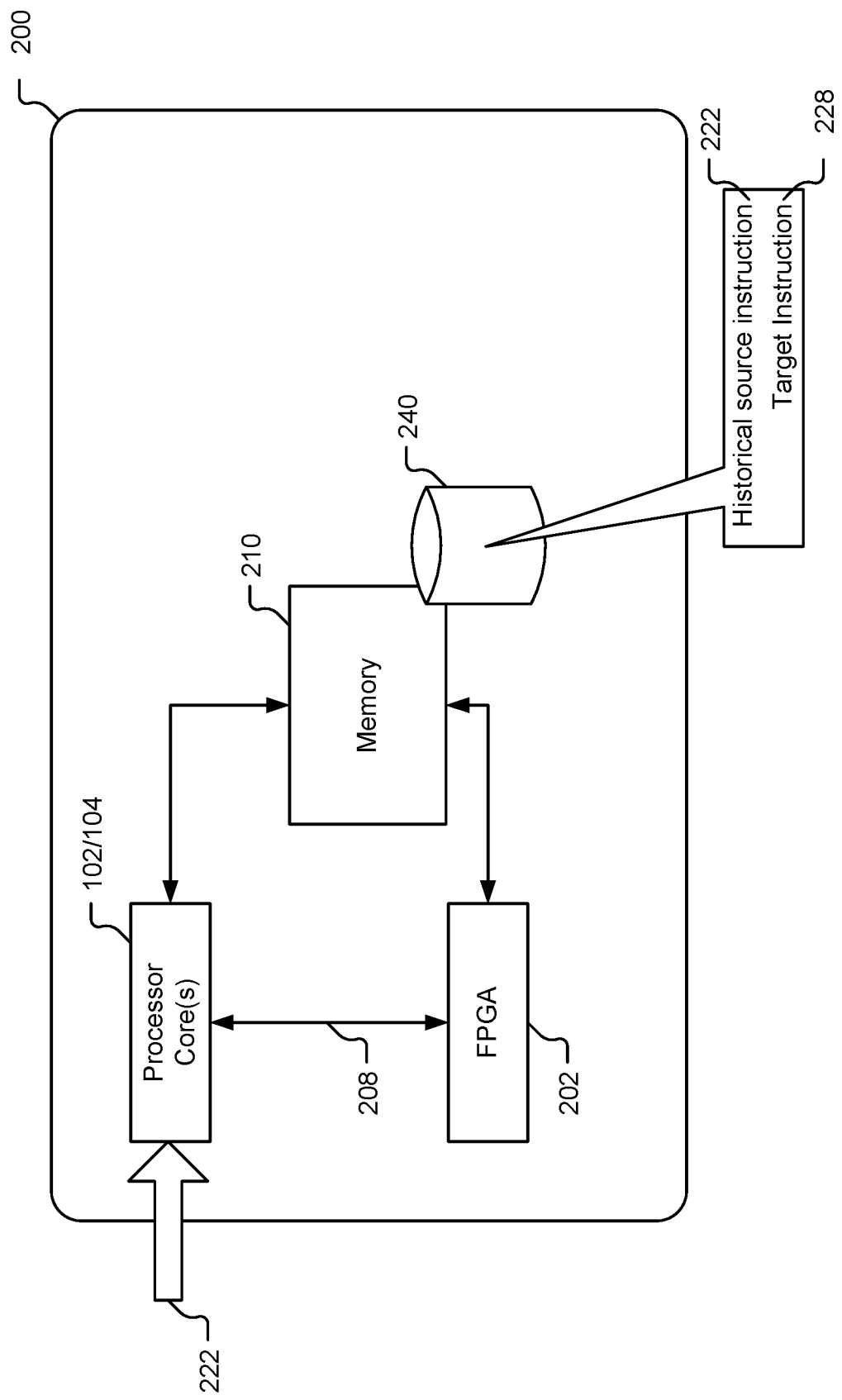
FIGS. 7-9 illustrate instruction prediction, according to exemplary embodiments.
Figure 8:
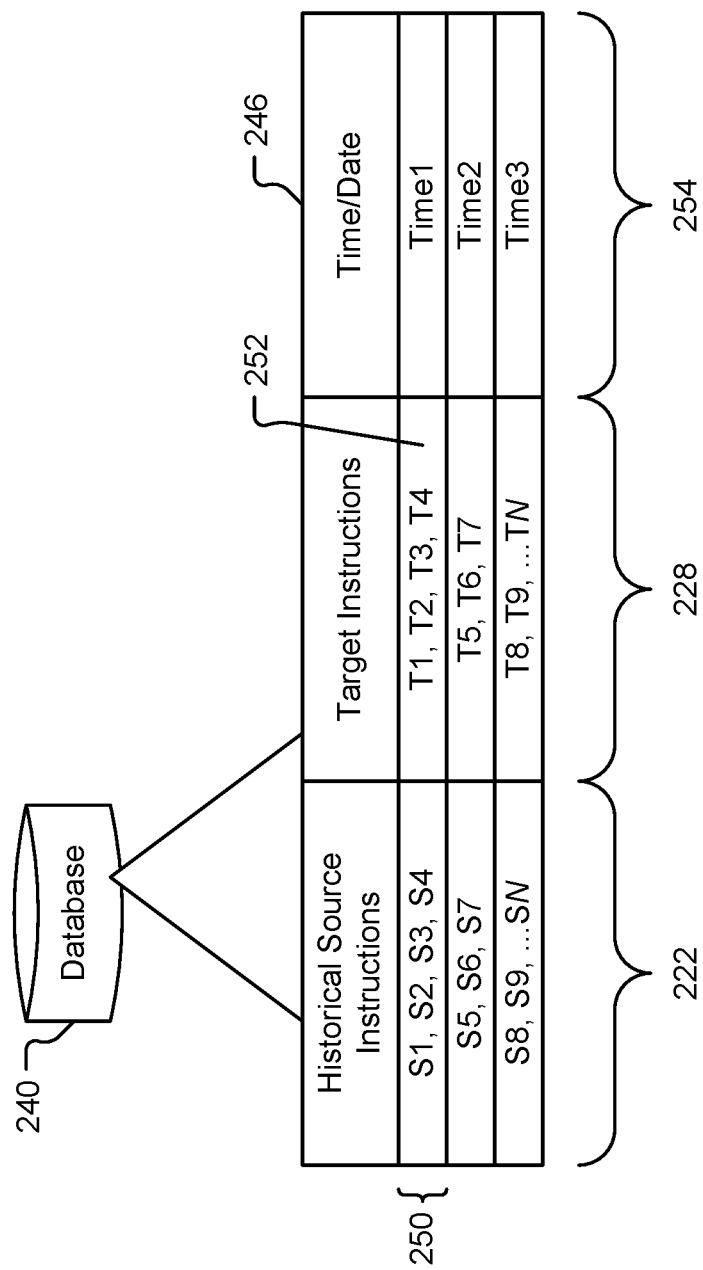
Figure 9:
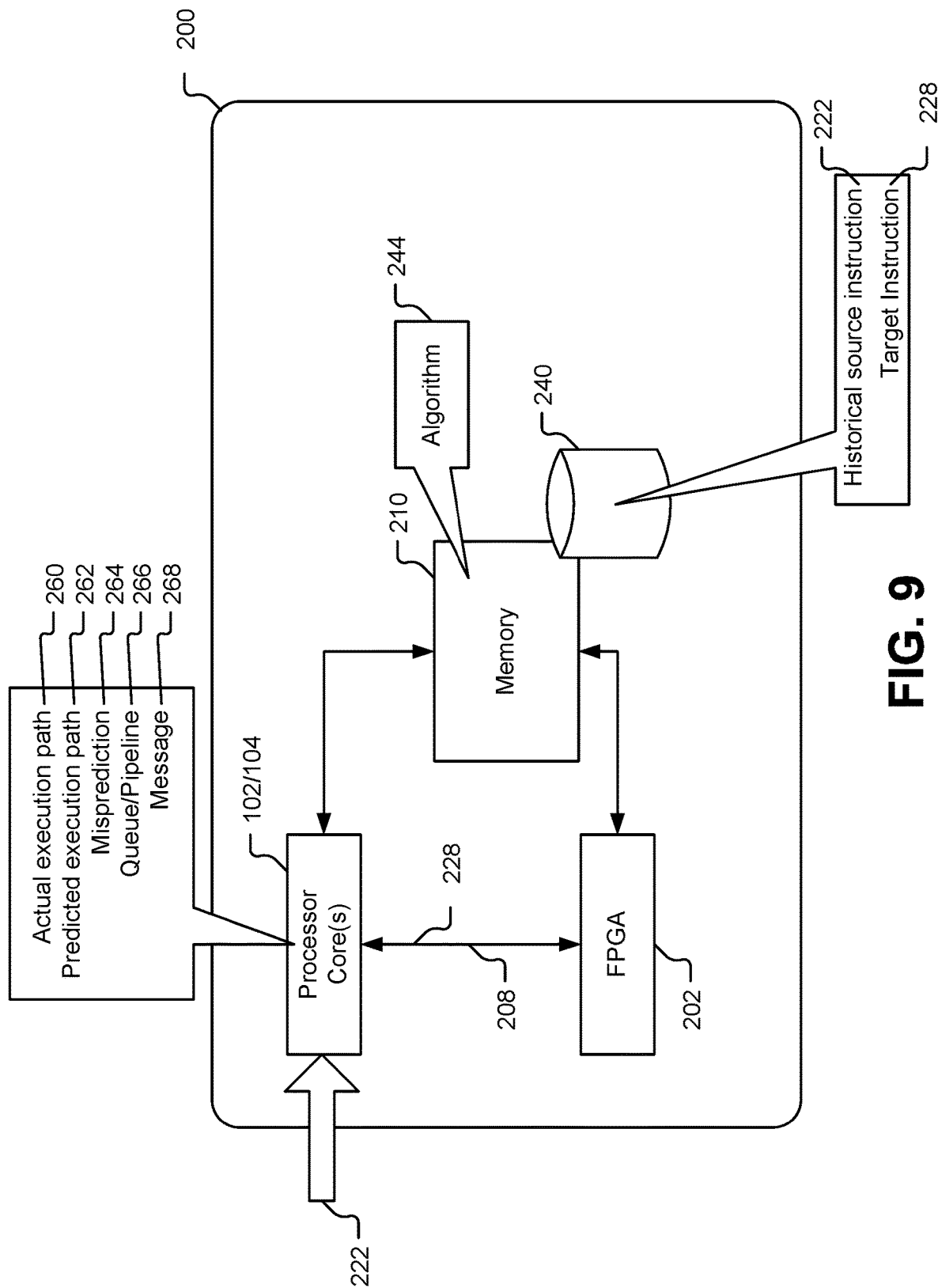

FIGS. 7-9 illustrate instruction prediction, according to exemplary embodiments. Here exemplary embodiments may also predict a priori the target instruction 228, based on past, historical execution of the source instruction 222. When the FPGA 202 receives the source instruction 222 (perhaps via the processor-to-FPGA communications link 208), the algorithm 244 may instruct or cause the FPGA 202 to predict or forecast the target instruction 228, perhaps without executing the binary translation 220. That is, exemplary embodiments may observe or inspect one or more of the source instructions 222 and compare to the database 240 of binary translations. Here the electronic database 240 of binary translations may additionally or alternatively store or log historical source instructions 222 that have been previously translated into their corresponding target instructions 228. While exemplary embodiments may use any scheme for pattern or signal determination, most readers are perhaps familiar with entry matching. If the FPGA 202 receives a sequence of the source instructions 222 that matches a historical input, then the FPGA 202 may nearly immediately retrieve the corresponding target instructions 228. The FPGA 202, in other words, may skip or fail to execute the binary translation 220 to provide an even faster result and to consume less electrical power.

FIG. 8 further illustrates electronic database 240 of binary translations. Here the table 246 electronically maps, relates, or associates different sequences 250 of the source instructions 222 to their corresponding sequences 252 of the target instructions 228. The database 240 of binary translations may also log or tag the corresponding date and time 254 of historical translation. The FPGA 202 captures or copies the sequence 250 of source instructions 222 and compares to entries in the database 240 of binary translations. If the database 240 of binary translations contains or specifies a matching entry, then the FPGA 202 may predict the output (e.g., the corresponding sequence 252 of the target instructions 228) without determining the block 230 of logic (as explained with reference to FIG. 406). The matching entry, in other words, allows the FPGA 202 to infer that the binary translation 220 is unnecessary. The FPGA 202 need only the identify and/or retrieve the corresponding historical sequence 252 of the target instructions 228. The FPGA 202 may then send the sequence 252 of the target instructions 228 (via the communications link 208) to the processor 102/104 for execution. Time, processing tasks, and electrical power have been saved by not repeatedly performing the binary translation 220 of historically-observed source instructions 222.

The FPGA 202 may thus predict future execution paths. As the source instructions 222 are input (perhaps in parallel) and scanned, the FPGA 202 may predict future execution paths beyond the branch/jump instructions that extend over multiple basic blocks. Streams of historically-observed source instructions 222 may thus be predicted to translate into the same corresponding streams of target instructions 228 for much faster execution, based on the entries in the database 240 of binary translations.

FIG. 9 illustrates a validation mechanism. Here the FPGA 202 may train its algorithm 244 using a scheme for machine learning. Sometimes a prediction (such as the historical sequence 252 explained with reference to FIGS. 7-8) may be incorrect, so the algorithm 244 may be modified and/or optimized based on feedback. As the processor 102/104 receives and queues the target instruction(s) 228 from the FPGA 202, the processor 102/104 may monitor an actual execution path 260 (executed by the processor 102/104) and compare to a predicted execution path 262 (provided by the FPGA 202, such as the historical sequence 252 illustrated in FIG. 8). When the predicted execution path 262 fails to match the actual execution path 260, then the processor 102/104 determines or flags a misprediction 264. In simple words, the misprediction 264 indicates that the FPGA 202 is providing incorrect target instructions 228. The misprediction 264 further implies that any queue or pipeline 266 of instructions is incorrect. The processor 102/104 may delete, or flush, the queue or pipeline 266 of instructions. The processor 102/104 may additionally or alternatively alert the FPGA 202 to the misprediction 264, such as by sending an alert or notification message 268 via the communications link 208. The alert or notification message 268 instructs the FPGA 202 to revert back to performing the binary translation 220, as the predictive scheme is yielding an error, flag, or difference. A resumption of the binary translation 200 thus refills or replenishes the queue or pipeline 266 with fresh translations. The misprediction 264 may thus rollback execution and the machine state to a point where a valid translated basic block is detected.

Exemplary embodiments may thus determine a predictive error. The processor 102/104 determines if there is an error in prediction by comparing against the correct result. Basically, as the cached target instructions 228 are being executed, the processor 102/104 will compare the executed target instructions 228 against an interpreted path (that is slower). If there is a wrong prediction detected, the queue or pipeline 266 of instructions will get flushed and the interpreted instructions (slower) will be committed. In the event of the misprediction 264, predictive execution may be slower than execution without prediction or using the FPGA 202. In other words, predictive execution may only provide a benefit if the prediction accuracy is high.

Exemplary embodiments may thus use the FPGA 202 as a predictor mechanism. As the FPGA 202 speculates, or predicts, branch instructions, exemplary embodiments rollback speculative instructions in the event of a mis-predict. The FPGA 202 speculates and predicts the target instructions 228 that will be executed in the future, based on past historical binary translations 220 stored or logged in the database 240 of binary translations. The misprediction 264 causes the algorithm 244 to refine its operations (such as by resuming the binary translation 220 and replacing mispredicted instructions in the database 240 of binary translations).

The FPGA 202 may thus be trained and adapted. Because the FPGA 202 is programmable, the algorithm 244 may be updated or rewritten to accommodate different classes of applications, verticals, etc. This capability is more flexible and accurate than conventional branch prediction heuristics, and the FPGA 202 may be self-optimized or refined by machine learning and by software updates. The solution thus alleviates security, cost and flexibility concerns around using proprietary CPUs and allows efficient execution of legacy code.

Figure 10:
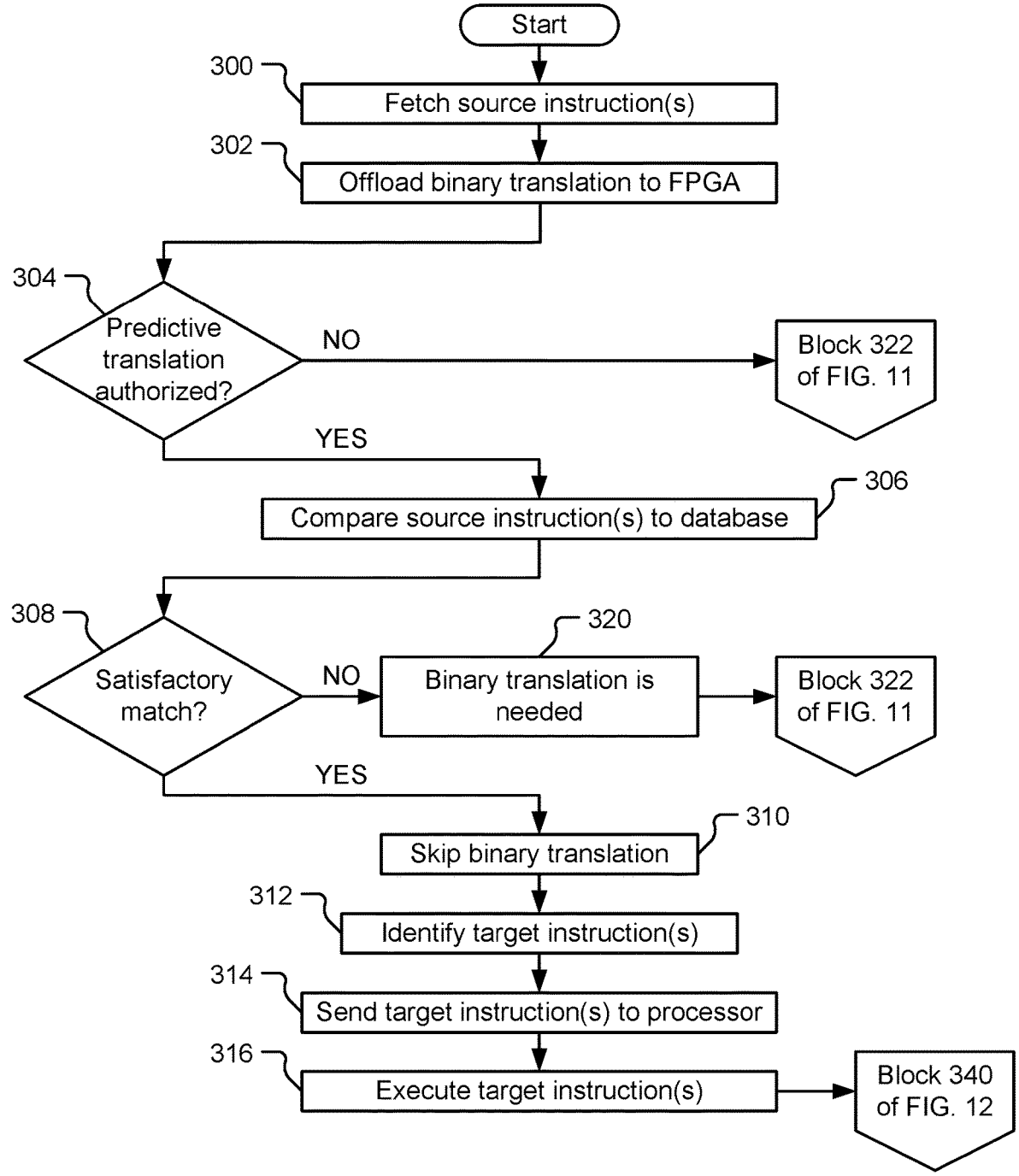
FIGS. 10-12 illustrate a flowchart for a method or algorithm for the hardware-assisted binary translation, according to exemplary embodiments.
Figure 11:
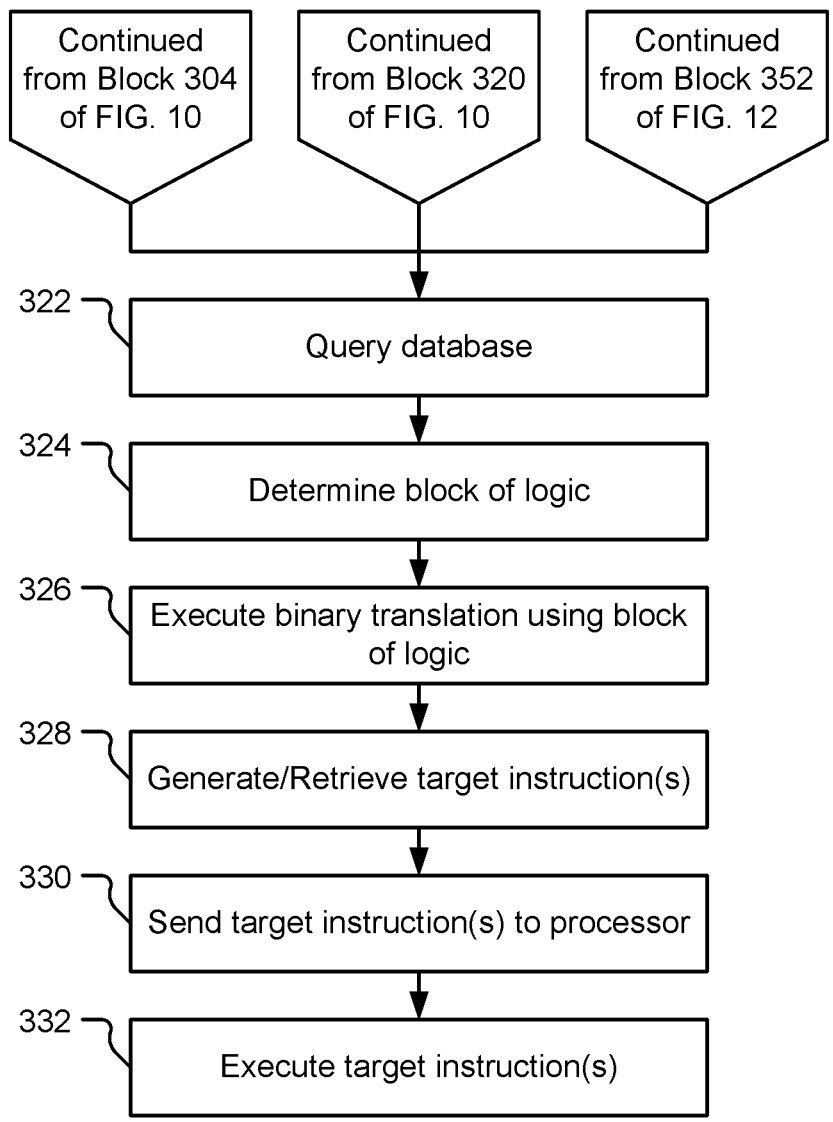
Figure 12:
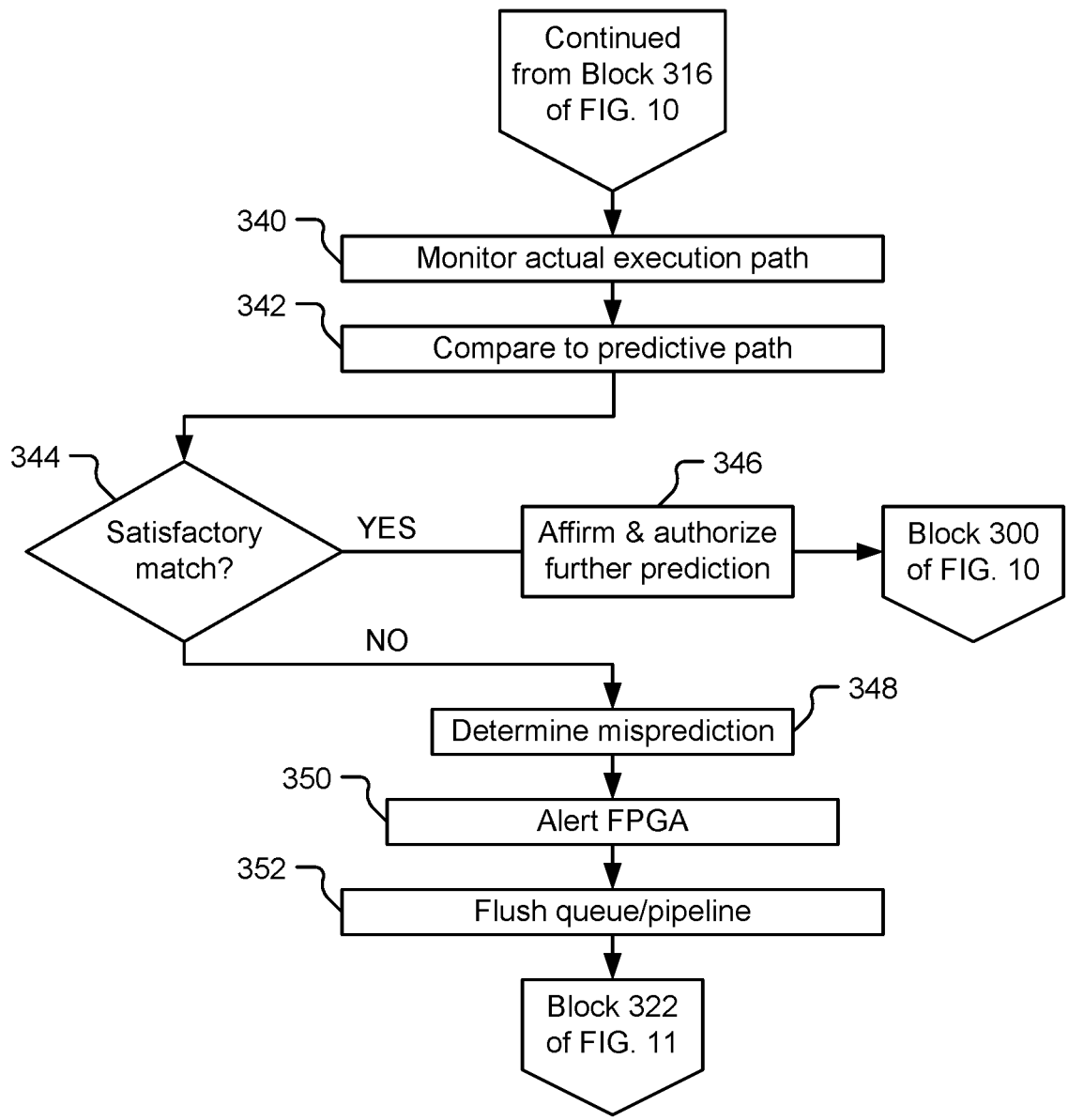

FIGS. 10-12 illustrate a flowchart of a method or algorithm for the hardware-assisted binary translation 220, according to exemplary embodiments. The integrated circuit 200 fetches or receives the source instructions 222 associated with the source instruction set architecture 224 (Block 300). The processor 102/104 in the integrated circuit 200 offloads the binary translation 220 to the FPGA 202 (Block 302). If predictive binary translation is authorized (Block 304), the source instructions 222 are compared to the entries in the electronic database 240 of binary translations (Block 306). If the source instructions 222 partially, substantially, or even exactly match an entry in the electronic database 240 of binary translations (Block 308), then the FPGA 202 may skip the binary translation 220 (Block 310) and identify and/or retrieve the corresponding target instructions 228 associated with the target instruction set architecture 226 (Block 312). The FPGA 202 sends the target instructions 228 to the processor 102/104 (Block 314), and the processor 102/104 executes the target instructions 228 (Block 316).

The flowchart returns to Block 308. If the source instructions 222 do not partially, substantially, or even exactly match any entry in the electronic database 240 of binary translations, then the binary translation 220 is needed (Block 320). As FIG. 11 illustrates, the database 240 of binary translations is queried (Block 322) to determine the block 230 of logic that performs the binary translation 220 (Block 324). The FPGA 202 executes the binary translation 220 using the block 230 of logic that corresponds to the source instruction set architecture 224 (Block 326). The FPGA 202 generates or retrieves the target instruction 228 according to the target instruction set architecture 226 (Block 328). The FPGA 202 sends the target instructions 228 to the processor 102/104 (Block 330), and the processor 102/104 executes the target instructions 228 (Block 332).

Now the flowchart returns to Block 316 of FIG. 10. Recall that the FPGA 202 has predicted the target instruction 228 based on historical logging in the database 240 of binary translations. Here, then, the processor 102/104 may validate an accuracy of predictive binary translation. As FIG. 12 illustrates, the processor 102/104 monitors the actual execution path 260 (Block 340) and compares to the predicted execution path 262 (Block 342). If the predicted execution path 262 satisfies or even matches the actual execution path 260 (Block 344), then the processor 102/104 affirms or authorizes predictive binary translation (Block 346) and the processor 102/104 fetches more source instructions (Block 300 of FIG. 11). However, if the predicted execution path 262 fails to match the actual execution path 260 (Block 344), then the processor 102/104 may determine the misprediction 264 (Block 348). The processor 102/104 alerts the FPGA 202 of the misprediction 264 (Block 350), and the processor 102/104 deletes or flushes the queue or pipeline 266 of instructions (Block 352). The FPGA 202 thus resumes the binary translation 220 (Block 322 of FIG. 11), thus refilling or replenishing the queue or pipeline 266 of instructions with fresh translations. 5

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (such as random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), an FPGA, a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method of processing instructions in an integrated circuit, the method comprising:
    receiving, by a hardware processor of the integrated circuit, source instructions associated with a source instruction set architecture;
    sending, by the hardware processor, the source instructions via a communications link to a field programmable gate array (FPGA) integrated in the integrated circuit;
    identifying, by the FPGA, a block of logic having gates within the FPGA by querying a database for at least one source instruction of the source instructions, the database associating blocks of logic to binary translations including the source instruction set architecture associated with the source instructions sent by the hardware processor;
    translating, by the identified block of logic, the at least one source instruction to at least one target instruction according to a native instruction set architecture executed by the hardware processor;
    comparing the at least one source instruction to entries in the database that log historical binary translations;
    identifying an entry of the entries in the database that matches the at least one source instruction;
    retrieving a sequence of target instructions referenced by the entry in the database that matches the at least one source instruction; and
    executing, by the hardware processor, the sequence of target instructions referenced by the entry in the database that matches the at least one source instruction.

2. The method of claim 1, further comprising sending a source identifier to the FPGA, the source identifier representing the source instruction set architecture.

3. A system, comprising:
    a hardware processor embedded in an integrated circuit;
    a field programmable gate array (FPGA) integrated in the integrated circuit; and
    a memory device embedded in the integrated circuit and accessible to the FPGA, the memory device storing instructions that when executed cause the FPGA to perform operations including:
        receiving a source instruction associated with a source instruction set architecture;
        determining a source identifier specified by the source instruction that uniquely identifies the source instruction set architecture;
        identifying a block of logic having gates within the FPGA by querying an electronic database for the source identifier specified by the source instruction, the electronic database associating source identifiers with blocks of logic within the FPGA that perform binary translations, the electronic database referencing the block of logic having the gates within the FPGA that is associated with the source identifier specified by the source instruction;
        performing a binary translation that translates the source instruction to a target instruction by the identified block of logic having the gates within the FPGA, the target instruction associated with a target instruction set architecture executed by the hardware processor;
        comparing the source instruction to a log of historical binary translations;

identifying a historical binary translation referenced by the log of historical binary translations that matches the source instruction;

identifying a sequence of target instructions associated with the historical binary translation referenced by the log of historical binary translations; and sending the sequence of target instructions from the FPGA via a communications link to the hardware processor.

4. The system of claim 3, wherein the operations further include predicting the sequence of target instructions based on the source instruction.

5. The system of claim 3, wherein the operations further include predicting future instructions based the sequence of target instructions.

6. A memory device storing instructions that when executed cause an integrated circuit to perform operations, the operations comprising:

receiving a source instruction specifying a source identifier that uniquely identifies a source instruction set architecture;

offloading a binary translation of the source instruction to a field programmable gate array (FPGA) integrated in the integrated circuit;

querying an electronic database for the source identifier specified by the source instruction, the electronic database stored by the integrated circuit, the electronic database electronically associating blocks of logic within the FPGA with identifiers including the source identifier specified by the source instruction;

identifying a block of logic of the blocks of logic within the FPGA that is electronically associated by the electronic database with the source identifier specified by the source instruction;

translating the source instruction to a target instruction via the identified block of logic within the FPGA that is electronically associated by the electronic database with the source identifier specified by the source instruction;

comparing the source instruction to historical binary translations obtained from the identified block of logic within the FPGA;

identifying a historical binary translation, of the historical binary translations, that references the source instruction;

identifying a sequence of target instructions associated with the historical binary translation that references the source instruction;

sending the sequence of target instructions within the integrated circuit from the FPGA to a hardware processor; and executing the sequence of target instructions by the hardware processor.

7. The memory device of claim 6, wherein the operations further include predicting the sequence of target instructions.

8. The memory device of claim 6, wherein the operations further include predicting the sequence of target instructions based on the historical binary translations.

\* \* \* \* \*